United States Patent [19]

Geva et al.

[11] Patent Number: 5,232,873
[45] Date of Patent: Aug. 3, 1993

[54] METHOD OF FABRICATING CONTACTS FOR SEMICONDUCTOR DEVICES

[75] Inventors: Michael Geva, Allentown, Pa.; Avishay Katz, Westfield, N.J.

[73] Assignee: AT&T Bell Laboratories, Murray Hill, N.J.

[21] Appl. No.: 960,526

[22] Filed: Oct. 13, 1992

[51] Int. Cl.$^5$ .................. H01L 21/283; H01L 21/225
[52] U.S. Cl. ...................... 437/192; 437/89; 437/160; 437/184; 148/DIG. 110
[58] Field of Search ............ 437/89, 90, 160, 162, 437/167, 192, 184; 748/DIG. 110; 257/751, 763, 770

[56] References Cited

U.S. PATENT DOCUMENTS

| | | | |
|---|---|---|---|
| 3,887,993 | 6/1975 | Okada et al. | 257/770 |
| 4,843,033 | 6/1989 | Plumton et al. | 437/161 |
| 5,071,798 | 12/1991 | Nakata | 437/192 |
| 5,086,016 | 2/1992 | Brodsky et al. | 437/190 |
| 5,089,438 | 2/1992 | Katz | 437/184 |
| 5,141,897 | 8/1992 | Manocha et al. | 437/228 |
| 5,158,896 | 10/1992 | Burroughes et al. | 437/5 |

OTHER PUBLICATIONS

Tiwari, S. et al. "Heterostructure Devices Using Self-Aligned p-Type Diffused Ohmic Contacts," *IEEE Electron Device Letters*, vol. 9, No. 8, Aug. 1988, pp. 422-424.

Tiwari, S. et al., "Lateral $Ga_{0.47}In_{0.53}As$ and GaAs p-i-n Photodetectors by Self-Aligned Diffusion," *IEEE Photonics Technology Letters*, vol. 4, No. 4, pp. 396-398.

Katz, A. et al., "Rapid Thermo Chemical Vapor Deposition of Silicon Dioxide Films onto InP", *Applied Physics Letters*, vol. 59, pp. 579-581 (1991).

Primary Examiner—T. N. Quach
Attorney, Agent, or Firm—D. I. Caplan

[57] ABSTRACT

A semiconductor device substrate has a major surface on which is located an insulating layer, such as silicon dioxide, having an aperture penetrating through it all the way down to the major surface. An impurity-doped plug, such as tungsten doped with zinc, is spatially selectively deposited in the aperture to a thickness such that the height of the plug is significantly less than the height of the aperture in the insulating layer, by means of a rapid-thermal-cycle low-pressure-metalorganic-chemical vapor deposition (RTC-LP-MOCVD) process. Then another plug, of (pure) conductive barrier metal such as tungsten, is deposited on at least the entire top surface of the impurity-doped plug and on the sidewalls of the insulating layer. The structure being fabricated can then be heated, in order to diffuse the impurity into the underlying semiconductor device substrate. A metallization layer such as titanium/platinum/gold can be deposited on the (pure) conductive barrier metal and patterned, in order to supply a desired access metallization for the device.

20 Claims, 1 Drawing Sheet

METHOD OF FABRICATING CONTACTS FOR SEMICONDUCTOR DEVICES

TECHNICAL FIELD

This invention relates to methods of fabricating semiconductor devices and more particularly to fabricating electrical contacts for such devices.

BACKGROUND OF THE INVENTION

Semiconductor devices such as heterojunction bipolar transistors, lasers, and photodetectors typically are fabricated in Group III-V compound semiconductor bodies. These devices typically have a top major surface that is coated with an insulating layer, such as silicon dioxide, that has an aperture through which a metallic contacting layer makes direct physical and electrical contact with the top surface of the semiconductor body in a region thereof of relatively high electrical conductivity (i.e., either a p+- or an n+-type semiconductor).

In a paper entitled "Lateral $Ga_{0.47}In_{0.53}As$ and GaAs p-i-n Photodetectors by Self-Aligned Diffusion," authored by S. Tiwari et al., and published in *IEEE Photonics Technology Letters*, Vol. 4, No. 4, pp. 396-398, a method of fabricating contacts to the top surface of a Group III-V compound, semiconductor epitaxial layer was taught. The purpose of such contacts is to enable electrical access to the top surface, typically p+-type material, of the device that is being fabricated. The contacts p+-type regions were fabricated by first forming an insulating layer on the top surface of the epitaxial layer and then forming at least one aperture in this insulating layer, followed by depositing, for example, by sputtering from a zinc-doped tungsten target, a metallic zinc-doped tungsten layer on the top surface of the structure being fabricated. Finally, some zinc is diffused from the zinc-doped tungsten layer into the epitaxial layer by, for example, rapid thermal processing.

Since any physical deposition process, and in particular sputtering, is a spatially non-selective deposition process, it is necessary somehow to pattern the metallic zinc-doped tungsten layer, lest its portions overlying the insulating layer in the device introduce an undesirably high parasitic capacitance (with respect to the epitaxial layer underlying the insulating layer). However, patterning of the metallic layer requires extra processing steps—such as lift-off or spatially selective etching, as by depositing and patterning a resist layer before or after depositing the zinc-doped tungsten metallic layer, respectively—and these extra steps tend to introduce reliability problems. More specifically, a lift-off of the metallic layer undesirably tends to lift off the underlying insulating layer. Moreover, any zinc-doped tungsten remaining, after the selective etching, anywhere on the surface of the insulating layer can undesirably result in a diffusion of zinc from the zinc-doped tungsten layer through the insulating layer to the epitaxial layer, whereby unwanted parasitic conducting paths in the epitaxial layer can be formed. Furthermore, in any case, the zinc that is present in the metallic layer can undesirably out-diffuse from the top surface of this metallic layer and thereby contaminate, and even reduce the electrical conductivity of, an overlying layer of another metal, such as gold, which is typically used for metallizing desired electrically conductive paths for electrical access to the device.

Moreover, sputtering as a process for depositing a layer of metal with a metallic impurity incorporated in it—such as the aforementioned layer of zinc-doped tungsten—has a disadvantage, whether the sputtering is performed with a single metallic target composed of the metal plus the impurity or with two pure targets (one composed of the metal, the other of the impurity). In the former case (single target), the composition of the single target is not stable owing to out-diffusion of the impurity at the elevated temperature of the target during the sputtering (bombardment of target) process, whereby the composition of the deposited layer is difficult to control, especially when processing one semiconductor body after another (as is desirable for sequential processing of many semiconductor devices). In the latter case (two targets), complex control systems are required to maintain the deposition rates of the two metals at the desired ratio, which can be undesirably costly.

SUMMARY OF THE INVENTION

One or more of the foregoing shortcomings is mitigated in accordance with the invention by a method of fabricating an electrical contact to a Group III-V or other semiconductor body comprising the steps of:

(a) providing a semiconductor body having a major surface;

(b) forming on at least a portion of the major surface an insulating layer of uniform thickness except for at least one aperture in it;

(c) spatially selectively depositing, by rapid-thermal-cycle low-pressure-metalorganic chemical vapor deposition, a first metallic layer selectively in the aperture to a prescribed thickness that is less than that of the thickness of the insulating layer, the first metallic layer comprising a first metal and an impurity, the impurity having a significantly greater tendency than the first metal to diffuse from the thus deposited metallic layer into the semiconductor body; and (d) spatially selectively depositing, by chemical vapor deposition, a second metallic layer at least everywhere on the first metallic layer in the aperture, the second metallic layer comprising a second metal but not the impurity, and the second metallic layer having the property of suppressing diffusion of the impurity through it.

It is also advantageous that, in addition, the method further comprise, following step (d), the step of forming a third metallic layer on the second metallic layer and on at least a portion of the insulating layer. It is also advantageous that the first and second metals are the same, advantageously essentially tungsten. It is also advantageous that the impurity is essentially zinc. It is also advantageous that steps (c) and (d) are performed in a single deposition chamber without removing the substrate from the chamber between performing these steps. It is also advantageous that the first metallic layer is heated—preferably subsequent to step (d)—to a temperature and for a time duration such that at least some of the impurity diffuses from the first metallic layer into the semiconductor body.

As used herein, the term "rapid-thermal-cycle" (RTC) refers to a deposition process in which the temperature is pulsed from a trough (minimum) value—typically room temperature—to a peak (maximum) value and back to the trough value once per thermal cycle, the deposition rate being essentially zero when the temperature is reduced to its trough value, and in which from cycle to cycle and during each cycle the partial pressure of all relevant gases in the deposition chamber is kept essentially constant. This term also includes the case of only a single cycle in which the partial pressure of all relevant gases are established prior to the (single) temperature pulse and remain established until after the temperature pulse has ceased.

BRIEF DESCRIPTION OF THE DRAWING(S)

FIG. 1 is an elevational cross-sectional side view diagram of a portion of a semiconductor device that has been fabricated in accordance with a specific embodiment of the invention.

Only for the sake of clarity, the drawing is not to any scale.

DETAILED DESCRIPTION

Figure 1:
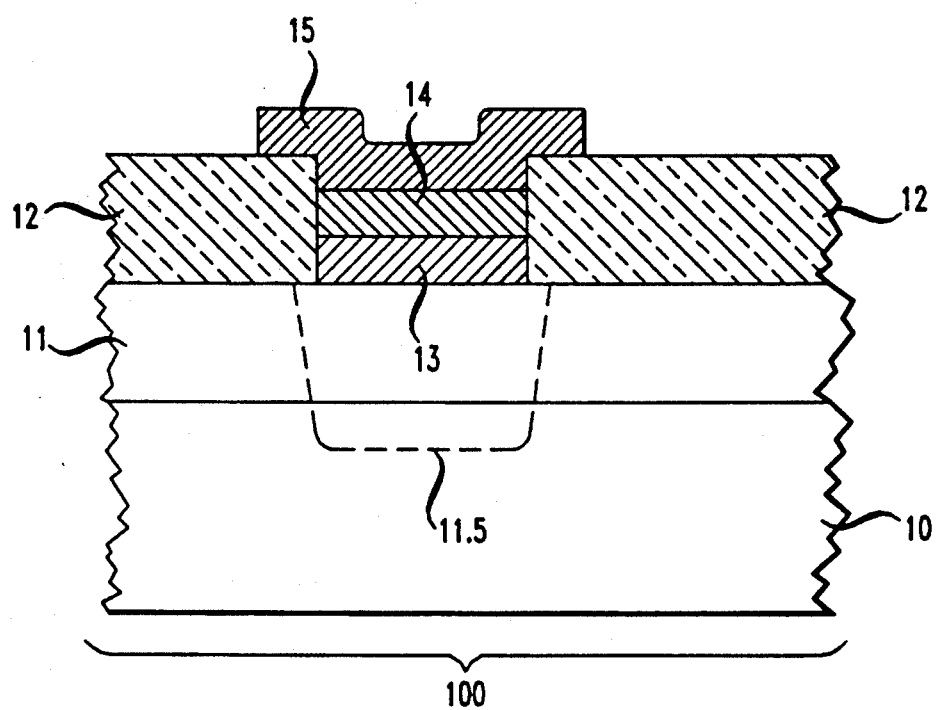

Referring now to FIG. 1, a portion 100 of a semiconductor device comprises an indium phosphide (InP) substrate 10, typically crystallographically oriented (100), on which has been epitaxially grown a lattice-matched $In_{0.53}Ga_{0.47}As$ (indium gallium arsenide) (hereinafter simply "InGaAs") p-type conductivity epitaxial layer 11. It should be understood that the substrate 10 has typically undergone various processing steps, in order to form a desired device structure—such as a laser, photodetector, or heterojunction transistor—to which electrical contact is to be made at its top surface. At the interface with the InGaAs epitaxial layer 11, the substrate 10 is typically somewhat p-type, but can be semiintrinsic.

A silicon dioxide insulating layer 12 has been deposited to a uniform thickness—typically in the approximate range of 0.5-to-1.0 μm—on the InGaAs layer 11, typically by means of a rapid thermal chemical vapor deposition (RT-CVD) process or a chemical vapor deposition (CVD) process. An aperture has been cut through the insulating layer 12, typically by means of a conventional photolithographic masking and etching procedure. A metallic plug 13 of zinc-doped tungsten—W(Zn)—has been formed in the aperture, by means of a spatially selective RTC-LP-MOCVD process, in such a manner that the plug 13 directly physically contacts the exposed portion of the top surface of the InGaAs layer 11 located in the aperture, but nowhere on the top surface of the insulating layer 12 does any substantial amount of W(Zn) accumulate. That is to say, the parameters of this RTC-LP-MOCVD process are chosen such that spatially selective deposition occurs. The plug 13 has a height in the approximate range of typically 0.03-to-0.05 μm—in any event, a height that is equal to significantly less than the thickness of the insulating layer 12, typically less than one-half the thickness of the insulating layer 12.

Located in the aperture overlying the metallic plug 13 is another metallic plug 14, made of substantially pure tungsten—i.e., tungsten that is substantially free of zinc or other metallic impurity that can undesirably outdiffuse into and contaminate an overlying patterned metallization layer 15. At least some of the zinc has diffused through the InGaAs layer 11 to the InP substrate 10, to form a diffused region 11.5 having p+-type conductivity. This diffused region 11.5 thus provides a desirably low electrical resistance path from the overlying metallization layer 15 to the InP substrate 10 (via the plug 14, the plug 13, and the portion of the diffused region 11.5 that is located in the InGaAs layer 11).

In order to form the illustrated portion 100 of the device, the InGaAs layer 11 and the silicon dioxide layer 12, together with its aperture, are formed on the substrate 10 by conventional procedures, as indicated above. Next, the plug 13 is formed by placing the substrate 10 in a deposition chamber of a heatpulse system. Typically, the system provides a load-locked, low pressure, horizontal laminar flow reaction chamber that is heated by high power halogen-tungsten lamps—as described in greater detail, for example, in a paper authored by A. Katz et al., entitled "Rapid Thermal Chemical Vapor Deposition of Silicon Dioxide Films onto InP," and published in *Applied Physics Letters*, Vol. 59, pp. 579-581 (1991).

More specifically, diethyl zinc (DEZn) and tungsten hexafluoride ($WF_6$), reduced by hydrogen ($H_2$) and diluted with argon (Ar), were used as the reactive gas mixture for spatially selectively depositing the W(Zn) plug 13. For example: the chamber pressure was held in the approximate range of 160-to-330 Pa; the temperature pulse height for a rapid thermal deposition process having but a single temperature pulse was in the approximate range of 450° C. to 500° C.; and the gas flow rates of the Ar, $H_2$, $WF_6$, and DEZn were in the respective approximate ranges of 200-to-250 SCCM, 2,000-to-2,500 SCCM, 30-to-40 SCCM, and 20-to-120 SCCM, where "SCCM" represents standard cubic centimeters per minute.

The substrates were loaded into the chamber immediately after being deoxidized in 10:1 $H_2O$:HF solution and after being degreased by means of a warm solution of chloroform, acetone, and methanol. The resulting deposition rate, for a temperature pulse height of approximately 500° C., was in the approximate range of 2-to-3 nm/sec, and resulted in a thickness of deposited W(Zn) in the approximate range of 0.04-to-0.03 μm for a single thermal cycle (single pulse) having a time duration in the approximate range of 20-to-90 seconds. Also, as a result of this temperature pulse (without further annealing), zinc can diffuse all the way through the InGaAs epitaxial layer 11 into the substrate 10, depending on the thickness of the epitaxial layer 11. For example, the diffusion depth of the zinc into the InGaAs layer 11, as determined by the extent of a region in it having a concentration of zinc that is equal to or greater than 1E18 ($=1\times10^{18}$) per $cm^3$, was in the approximate range of 150-to-190 nm for a gas mixture containing 80 SCCM of DEZn and 50 SCCM of $WF_6$, with a single thermal pulse having a height of 500° C. and a duration of 20 sec. A post-deposition anneal at temperatures as high as 500° C. for 10 sec increased the zinc diffusion depth only slightly. Nevertheless, a post-deposition anneal can be advantageous, preferably after the deposition of the (pure) tungsten plug 14 because it can provide a very accurate technique, which is independent of prior processing, to control the depth of the junction formed as a result of the Zn diffusion into the substrate 10.

After the formation of the W(Zn) plug 13, the (substantially pure) tungsten plug 14 is spatially selectively deposited typically by a conventional LP-CVD process involving the reduction of $WF_6$ by $H_2$. Advantageously, this latter process is performed in situ; that is, it is performed in the same chamber as the W(Zn) plug 13 was deposited by RTC-LP-CVD and without removing the substrate from the chamber between the (RTC-LP-MOCVD) deposition of the W(Zn) plug 13 and (LP-CVD) deposition of the W plug 14. Here again, the deposition parameters are chosen so that substantially none of the tungsten is deposited on the top surface of the silicon dioxide layer 12—i.e., so that the tungsten is deposited in a spatially selective manner. Finally, the patterned metallization layer 15 is formed, typically of titanium-platinum-gold: first depositing a titanium layer everywhere on the top surface of the structure being fabricated, then a platinum layer everywhere, and then a gold layer everywhere, followed by patterning these three layers in accordance with the desired metallization (conducting-access-line) pattern.

Although the invention has been described in detail with respect to a specific embodiment, various modifications can be made without departing from the scope of the invention. For example, instead of or in addition to zinc, other impurities (or combinations of them) can be used such as tin, sulfur, silicon, beryllium, germanium, or magnesium (or combinations of them). Instead of p-type InGaAs, the epitaxial layer 11 can be n-type InGaAs, or can be n-type or p-type InP, depending upon the impurities and the desired device characteristics. Also, instead of or in addition to tungsten other barrier metals or alloys or intermetallics can be used for the metallic plugs 13 and 14—such as gold, titanium, or chromium. Finally, the barrier metal(s) contained in the plug 14 need not be the same as the barrier metal(s) contained in the plug 13.

We claim:

1. In a method of fabricating a semiconductor device, the steps of:
   (a) providing a semiconductor body having a major surface;
   (b) forming on at least a portion of the major surface an insulating layer of uniform thickness except for at least one aperture in it;
   (c) spatially selectively depositing, by rapid-thermal-cycle low-pressure-metalorganic chemical vapor deposition, a first metallic layer selectively in the aperture to a prescribed thickness that is less than that of the thickness of the insulating layer, the first metallic layer comprising a first metal and an impurity, the impurity having a significantly greater tendency than the first metal to diffuse from the thus deposited metallic layer into the semiconductor body; and
   (d) spatially selectively depositing, by chemical vapor deposition, a second metallic layer at least everywhere on the first metallic layer in the aperture, the second metallic layer comprising a second metal but not the impurity, and the second metallic layer having the property of suppressing diffusion of the impurity through it.

2. The method of claim 1 further comprising, following step (d), the step of forming a third metallic layer on at least a part of the insulating layer and on the second metallic layer.

3. The method of claim 2 in which the first and second metals are the same elements.

4. The method of claim 3 in which the first and second metals are essentially tungsten and the impurity is essentially zinc.

5. The method of claim 4 in which steps (c) and (d) are performed in a single deposition chamber.

6. The method of claim 3 further comprising the step of heating the first metallic layer to a prescribed temperature for a prescribed amount of time whereby at least some of the impurity diffuses from the first metallic layer into the semiconductor body.

7. The method of claim 2 further comprising the step of heating the first metallic layer to a prescribed temperature for a prescribed amount of time whereby at least some of the impurity diffuses from the first metallic layer into the semiconductor body.

8. The method of claim 1 in which the first and second metals are essentially tungsten and the impurity is essentially zinc.

9. The method of claim 8 further in which steps (c) and (d) are performed in-situ in a single deposition chamber without removing the body from the chamber between performing steps (c) and (d).

10. The method of claim 8 further comprising the step of heating the first metallic layer to a prescribed temperature for a prescribed amount of time whereby at least some of the impurity diffuses from the first metallic layer into the semiconductor body.

11. The method of claim 1 in which the first and second metals are essentially tungsten.

12. The method of claim 11 further comprising, following step (d), the step of forming a third metallic layer on at least a part of the insulating layer and on the second metallic layer.

13. The method of claim 12 further comprising the step of heating the first metallic layer to a prescribed temperature for a prescribed amount of time whereby at least some of the impurity diffuses from the first metallic layer into the semiconductor body.

14. The method of claim 1 in which the impurity is essentially zinc.

15. The method of claim 14 further comprising, following step (d), the step of forming a third metallic layer on at least a part of the insulating layer and on the second metallic layer.

16. The method of claim 15 in which steps (c) and (d) are performed in a single deposition chamber.

17. The method of claim 15 further comprising the step of heating the first metallic layer to a prescribed temperature for a prescribed amount of time whereby at least some of the impurity diffuses from the first metallic layer into the semiconductor body.

18. The method of claim 1 in which steps (c) and (d) are performed in a single deposition chamber.

19. The method of claim 18 further comprising the step of heating the first metallic layer to a prescribed temperature for a prescribed amount of time whereby at least some of the impurity diffuses from the first metallic layer into the semiconductor body.

20. The method of claim 1 further comprising the step of heating the first metallic layer to a prescribed temperature for a prescribed amount of time whereby at least some of the impurity diffuses from the first metallic layer into the semiconductor body.

* * * * *